(12) United States Patent
Koizumi et al.

(10) Patent No.: US 9,722,126 B2
(45) Date of Patent: Aug. 1, 2017

(54) PHOTOCONDUCTIVE DEVICE, MEASUREMENT APPARATUS, AND MANUFACTURING METHOD

(71) Applicant: CANON KABUSHIKI KAISHA, Tokyo (JP)

(72) Inventors: Takayuki Koizumi, Yokohama (JP); Toshihiko Ouchi, Machida (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 15/228,959

(22) Filed: Aug. 4, 2016

(65) Prior Publication Data

US 2017/0062644 A1    Mar. 2, 2017

(30) Foreign Application Priority Data

Aug. 25, 2015 (JP) ................................. 2015-166053

(51) Int. Cl.
*H01L 27/15* (2006.01)
*H01L 31/167* (2006.01)
(Continued)

(52) U.S. Cl.
CPC .............. *H01L 31/167* (2013.01); *G01J 5/20* (2013.01); *H01L 31/028* (2013.01); *H01L 31/02161* (2013.01); *H01L 31/0304* (2013.01); *H01L 31/03044* (2013.01); *H01L 31/03046* (2013.01); *H01L 31/1828* (2013.01); *H01L 33/0062* (2013.01); *H01L 33/30* (2013.01);
(Continued)

(58) Field of Classification Search
CPC ............. H01L 31/167; H01L 31/02161; H01L 31/028; H01L 31/0304; H01L 31/03044; H01L 31/03046; H01L 31/1828; H01L 33/0062; H01L 33/30; H01L 33/32; H01L 33/34; H01L 33/44; H01L 21/0425; G01J 5/20
USPC .......................................................... 257/84
See application file for complete search history.

(56) References Cited

U.S. PATENT DOCUMENTS

| 8,481,945 B2* | 7/2013 | Koyama ................. G02F 1/353 250/341.1 |
| 2007/0297484 A1* | 12/2007 | Mochizuki .......... H01S 5/18313 372/99 |
| 2014/0346357 A1 | 11/2014 | Jarrahi et al. |

FOREIGN PATENT DOCUMENTS

JP    2013-080939 A    5/2013

* cited by examiner

*Primary Examiner* — Tu-Tu Ho
(74) *Attorney, Agent, or Firm* — Canon U.S.A., Inc., IP Division

(57) ABSTRACT

A photoconductive device that generates or detects terahertz radiation includes a semiconductor layer; a structure portion; and an electrode. The semiconductor layer has a thickness no less than a first propagation distance and no greater than a second propagation distance, the first propagation distance being a distance that the surface plasmon wave propagates through the semiconductor layer in a perpendicular direction of an interface between the semiconductor layer and the structure portion until an electric field intensity of the surface plasmon wave becomes 1/e times the electric field intensity of the surface plasmon wave at the interface, the second propagation distance being a distance that a terahertz wave having an optical phonon absorption frequency of the semiconductor layer propagates through the semiconductor layer in the perpendicular direction until an electric field intensity of the terahertz wave becomes $1/e^2$ times the electric field intensity of the terahertz wave at the interface.

18 Claims, 7 Drawing Sheets

(51) Int. Cl.
  *G01J 5/20* (2006.01)
  *H01L 31/0216* (2014.01)
  *H01L 31/0304* (2006.01)
  *H01L 31/028* (2006.01)
  *H01L 31/18* (2006.01)
  *H01L 33/44* (2010.01)
  *H01L 33/30* (2010.01)
  *H01L 33/32* (2010.01)
  *H01L 33/34* (2010.01)
  *H01L 33/00* (2010.01)

(52) U.S. Cl.
  CPC .............. *H01L 33/32* (2013.01); *H01L 33/34* (2013.01); *H01L 33/44* (2013.01)

PHOTOCONDUCTIVE DEVICE, MEASUREMENT APPARATUS, AND MANUFACTURING METHOD

BACKGROUND OF THE INVENTION

Field of the Invention

The present invention relates to a photoconductive device, a measurement apparatus including the photoconductive device, and a method of manufacturing a photoconductive device.

Description of the Related Art

A terahertz wave is an electromagnetic wave having a frequency of no less than 30 GHz and no greater than 30 THz. A photoconductive device can be used as a device for generating or detecting a terahertz wave. A photoconductive device is constituted by a semiconductor material that has relatively high mobility and has a carrier lifetime of no greater than a picosecond, and by antenna electrodes (bias lines) that also serve as electrodes provided on the semiconductor. When a gap portion between the antenna electrodes is irradiated with ultrashort pulsed light, in a state in which a voltage is applied across the antenna electrodes, a current flows instantaneously between the antenna electrodes due to excited optical carriers, and thus the photoconductive device radiates a terahertz wave. In order to carry out accurate measurement of terahertz radiation, by using such a photoconductive device, there is a demand for an increase in the power of a terahertz wave generated by a photoconductive device, an increase in the detection sensitivity of the terahertz wave, and an increase in the generation or detection bandwidth of the terahertz wave.

As a means for increasing the generation power and the detection sensitivity of a photoconductive device, Japanese Patent Application Laid-Open No. 2013-80939 describes a photoconductive device in which a semiconductor layer formed of epitaxially grown GaAs is disposed on a substrate having low terahertz-wave absorptivity with a carrier movement prevention layer disposed between the substrate and the GaAs layer. Disposing the carrier movement prevention layer between the substrate and the GaAs layer makes it possible to reduce the movement of generated excitation carriers toward the substrate and therefore increases the amount of excitation carriers used to generate or detect a terahertz wave.

In addition, U.S. Patent Application Publication No. 2014/0346357 describes a photoconductive device provided with a diffraction grating that produces surface plasmon resonance between electrodes. Being provided with the diffraction grating, the photoconductive device described in U.S. Patent Application Publication No. 2014/0346357 enhances the electric field of excitation light on a semiconductor surface of a gap portion between the antenna electrodes and thus increases the amount of light absorption in the semiconductor. This configuration increases the generation efficiency of optical carriers. Specifically, a periodical structure in the order of submicrons, such as a diffraction grating, is formed between the antenna electrodes by a material having a negative dielectric constant, such as metal. Free electrons in the diffraction grating collectively vibrate upon being irradiated with ultrashort pulsed light, which induces surface plasmon resonance. Characteristic features of the surface plasmon resonance include an electric field enhancement effect and a magnetic field localization effect, which enable an increase in the generation efficiency of optical carriers in the vicinity of an interface between the diffraction grating and the semiconductor. U.S. Patent Application Publication No. 2014/0346357 reports that the power of the generated terahertz wave is higher by ten times or more when a diffraction grating is provided between the antenna electrodes than when the diffraction grating is not provided.

SUMMARY OF THE INVENTION

A photoconductive device that generates or detects terahertz radiation according to an aspect of the present invention includes a semiconductor layer; a structure portion in contact with the semiconductor layer, the structure portion being configured to receive light input from a light source and to excite a surface plasmon wave with the light; and an electrode electrically connected to the structure portion. The semiconductor layer has a thickness that is no less than a first propagation distance and no greater than a second propagation distance, the first propagation distance being a distance that the surface plasmon wave propagates through the semiconductor layer in a perpendicular direction of an interface between the semiconductor layer and the structure portion until an electric field intensity of the surface plasmon wave becomes 1/e times the electric field intensity of the surface plasmon wave at the interface, the second propagation distance being a distance that a terahertz wave having an optical phonon absorption frequency of the semiconductor layer propagates through the semiconductor layer in the perpendicular direction until an electric field intensity of the terahertz wave becomes $1/e^2$ times the electric field intensity of the terahertz wave at the interface.

Further aspects of the present invention will become apparent from the following description of exemplary embodiments with reference to the attached drawings.

DESCRIPTION OF THE EMBODIMENTS

In a photoconductive device, a terahertz wave having an optical phonon absorption frequency (hereinafter, referred to as a "phonon absorption frequency") $f_F$ may be absorbed through optical phonon absorption (hereinafter, referred to as "phonon absorption") by a semiconductor layer in the photoconductive device. In order to reduce the phonon absorption, it is desirable that the thickness of the semiconductor layer be reduced and the distance that a generated terahertz wave or a terahertz wave to be detected propagates through the semiconductor layer be reduced. However, when the thickness of the semiconductor layer is reduced excessively, the amount of absorption of the excitation light may be reduced, and the generation efficiency or the detection efficiency of the terahertz wave may decrease.

The various embodiments of the present invention are directed to providing a photoconductive device that can generate or detect a terahertz wave over a broad band, while a decrease in the generation efficiency or the detection efficiency is suppressed. Hereinafter, exemplary embodiments of the present invention will be described, but the present invention is not to be limited to the following exemplary embodiments.

First Exemplary Embodiment

Figure 1A:
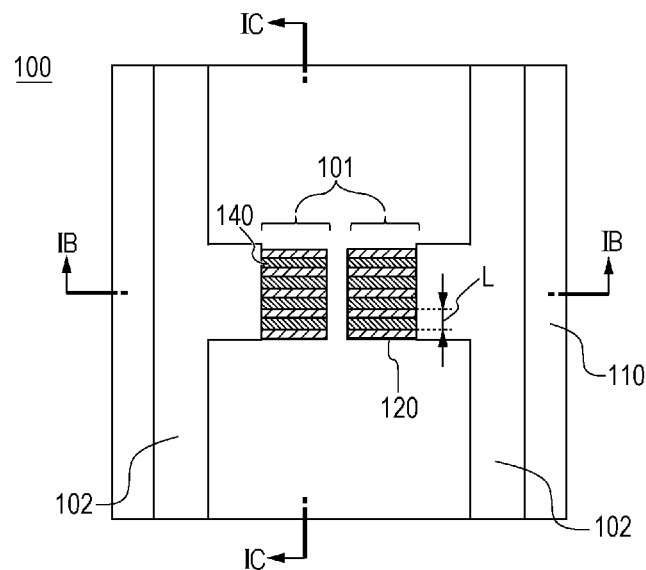
FIG. 1A is a top view schematic for describing a configuration of a photoconductive device according to a first exemplary embodiment.
Figure 1B:
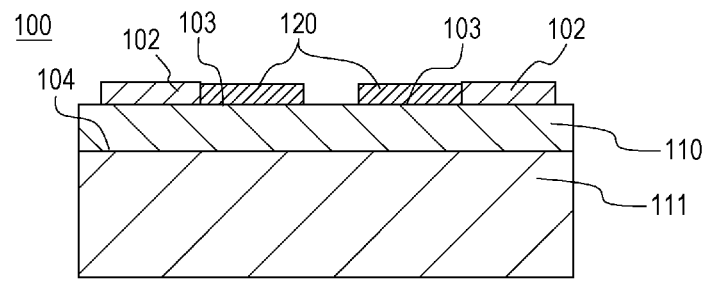
FIG. 1B is a sectional view taken along the IB-IB line of the photoconductive device of FIG. 1A, according to the first exemplary embodiment.
Figure 1C:
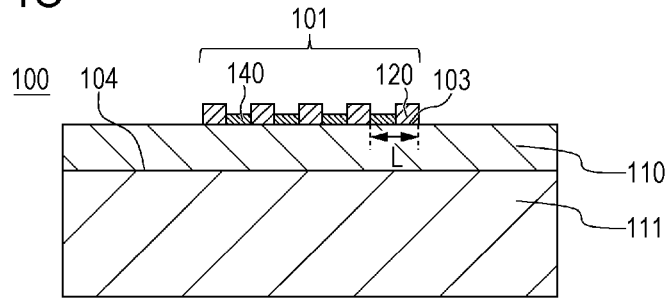
FIG. 1C is another sectional view taken along the IC-IC line of the photoconductive device of FIG. 1A, according to the first exemplary embodiment.

A photoconductive device 100 (hereinafter, referred to as the device 100) according to a first exemplary embodiment will be described. FIG. 1A is a top view for describing a configuration of the device 100. FIG. 1B is a sectional view taken along the IB-IB line indicated in FIG. 1A. FIG. 1C is a sectional view taken along the IC-IC line indicated in FIG. 1A. The device 100 includes a semiconductor layer 110, a substrate 111, a plurality of electrodes (bias lines) 102, and structure portions 101.

The semiconductor layer 110 is a photoconductive layer that generates carriers upon ultrashort pulsed light serving as excitation light being incident thereon. The semiconductor layer 110 may be constituted by a single layer or by a plurality of layers. The term "ultrashort pulsed light" as used in the present specification refers to pulsed light having a pulse duration in the order of femtoseconds. As the ultrashort pulsed light is incident on the device 100, a pulse wave of a terahertz wave can be generated or detected.

Typically, a semiconductor material of which wavelength corresponding to the band gap energy of the semiconductor layer 110 is longer than the wavelength of the excitation light is selected as a material for the semiconductor layer 110, and excitation of carriers through one-photon absorption is utilized. Therefore, in the case of one-photon absorption, the material for the semiconductor layer 110 can be selected in accordance with the wavelength of the excitation light. For example, when the wavelength of the excitation light is in a 0.8 μm band, low temperature grown (hereinafter, referred to as "LT") gallium arsenide (LT-GaAs) can be used. Aside from LT-GaAs, semiinsulating (hereinafter, referred to as "SI") GaAs (SI-GaAs) or semiinsulating indium phosphide (SI-InP) can be used. When the wavelength of the excitation light is in a 1.55 μm band, low temperature grown indium gallium arsenide (LT-InGaAs), germanium (Ge), or the like can be used.

A material of which wavelength corresponding to the band gap energy is shorter than the wavelength of the excitation light can also be used as a material for the semiconductor layer 110. In this case, carrier excitation through multiphoton absorption, which is one of the non-linear optical effects, can be utilized. With two-photon absorption taken as an example, when the wavelength of the excitation light is in a 0.8 μm band, gallium nitride (GaN) can be used as a material for the semiconductor layer 110.

When the wavelength of the excitation light is in a 1.55 μm band, LT-GaAs, low temperature grown indium arsenide (LT-InAs), low temperature grown indium antimonide (LT-InSb), low temperature grown indium arsenide antimonide (LT-InAsSb), SI-GaAs, or the like can be selected. Aside from the above, a material containing indium gallium antimonide (InGaSb) can also be used as a material for the semiconductor layer 110.

The semiconductor layer 110 is disposed on the substrate 111. The semiconductor layer 110 may be disposed on the substrate 111 by epitaxially growing the semiconductor layer 110 on the substrate 111 or by affixing the semiconductor layer 110 through transfer. When the semiconductor layer 110 is to be epitaxially grown, the thickness of the semiconductor layer 110 can be adjusted by adjusting the growth conditions, such as a growth time. When the semiconductor layer 110 is to be transferred onto the substrate 111, the thickness of the semiconductor layer 110 can be adjusted by etching the semiconductor layer 110 after the transfer. It is to be noted that the semiconductor layer 110 does not have to be disposed on the substrate 111 and may be directly disposed on a lens (not illustrated) for collimating a terahertz wave, for example.

The plurality of bias lines 102 are disposed on the semiconductor layer (the semiconductor layer 110) such that a gap (gap portion) is provided between the adjacent bias lines 102. In the present exemplary embodiment, each of the bias lines 102 includes a projection portion, and the projection portions of the adjacent bias lines 102 oppose each other with a certain space provided therebetween. It is desirable that a material that has high electrical conductivity and that is less prone to oxidation be used as a material for the bias lines 102, and specific examples of such a material include gold (Au), silver (Ag), aluminum (Al), copper (Cu), and platinum (Pt). The configuration may be such that the device 100 includes only a single bias line 102.

The bias lines 102 also function as antennas for coupling the space outside the device 100 with a terahertz wave in order to generate or detect the terahertz wave. The shape of the antenna is determined in accordance with the frequency, the power, and so on of a terahertz wave to be generated or detected. The type of the antenna to be used can be, but is not particularly limited to, a stripline antenna, a bow-tie antenna, a dipole antenna, a log spiral antenna, or the like, for example. In the present exemplary embodiment, a dipole antenna that can generate or detect a terahertz wave over a broad band with the two bias lines 102 is used as an example. In addition, the bias lines 102 also function as electrodes, and a voltage can be applied across the bias lines 102, or a current flowing between the projection portions of the bias lines 102 can be measured. It is to be noted that providing at least one or more bias lines 102 may suffice, and the bias lines 102 do not necessarily have to function as antennas.

As illustrated in FIG. 1B, the bias lines 102 are electrically connected to the structure portions 101. Specifically, the two bias lines 102 each having a projection portion whose leading end is electrically connected to the structure portion 101 are provided on the semiconductor layer 110. As the structure portions 101 are irradiated with the excitation light, the optical absorption efficiency of the excitation light by the semiconductor layer 110 improves due to the surface plasmon resonance. Although the two bias lines 102 are electrically connected to the respective structure portions 101 in the present exemplary embodiment, it may suffice that at least one of the bias lines 102 be electrically connected to one structure portion 101.

The structure portion 101 is a periodical structure portion in which a plurality of lattices 120 are disposed periodically at a predetermined pitch. In the present specification, a region including the plurality of lattices 120 and a region between the lattices 120 is referred to as the structure portion 101. The structure portion 101 includes a plurality of rectangular parallelepiped lattices 120 that are formed of a material having high electrical conductivity. The plurality of lattices 120 are disposed periodically at constant intervals (at a predetermined pitch). In other words, in the structure portion 101, a plurality of grooves are formed periodically in a conductive member disposed on the semiconductor layer 110. It is to be noted that not all of the lattices 120 in the structure portions 101 need to be electrically connected to the bias lines 102, and the configuration may be such that at least some of the lattices 120 are connected to the bias lines 102.

Similarly to the material for the bias lines 102, it is desirable that a material that has high electrical conductivity and that is less prone to oxidation be used as a material for the structure portion 101. Specifically, Au, Ag, Al, Cu, Pt, or the like is used. When Au is used as a material for the structure portion 101, an Au layer may be disposed on the semiconductor layer 110 with a titanium (Ti) layer interposed therebetween in order to ensure the adhesiveness between the Au layer and the semiconductor layer 110. In this case, the structure portion 101 includes the Au layer and the Ti layer. In addition, the structure portion 101 may include an anti-reflection film 140 for suppressing reflection provided on a surface on which the excitation light is first incident, and the anti-reflection film 140 may be provided at least in a region that is irradiated with the excitation light (irradiation region). In this manner, the configuration of the structure portion 101 is not limited to the one in which the structure portion 101 includes only a single layer, and the structure portion 101 may include a plurality of layers. It is desirable that the irradiation region of the excitation light be within a smallest region that contains each of two structure portions 101.

It is desirable that the size of the gap between the structure portions 101 be determined with a withstanding voltage of the semiconductor layer 110 taken into consideration in the case of a photoconductive device for generating a terahertz wave or determined with a dark current taken into consideration in the case of a photoconductive device for detecting a terahertz wave. For example, when the semiconductor layer 110 is formed of LT-GaAs, it is preferable that the size of the gap between the structure portions 101 be set to approximately no less than 1.0 μm and no greater than several ten μm. In order to secure a withstanding voltage of approximately 100 V, it is preferable that the size of the gap be set to approximately 10 μm.

Hereinafter, a condition under which the surface plasmon resonance is excited will be described. The surface plasmon resonance can be excited most efficiently when the polarization direction of the excitation light is parallel to the periodic direction (the direction along the IC-IC line indicated in FIG. 1A) of the lattices 120 of the structure portion 101 (hereinafter, simply referred to as the periodic direction). The condition for the surface plasmon resonance is expressed through the expression (2). Herein, c represents the light speed of the excitation light, λ represents the wavelength of the excitation light, ω represents the angular frequency of the excitation light, θ represents the angle of incidence of the excitation light relative to the device 100, and L represents the period of the lattices 120 in the periodicity direction, i.e., in the direction of line IC-IC of FIG. 1A. In addition, $\varepsilon_g$ represents the complex dielectric constant of the material for the lattices 120 of the structure portion 101 with respect to the wavelength λ of the excitation light, and $\varepsilon_p$ represents the effective complex dielectric constant determined by the distribution of the complex dielectric constant of one or a plurality of substances in contact with the lattices 120 (effective complex dielectric constant).

$$\frac{\omega}{c}\sin\theta + \frac{2\pi m}{L} = \frac{\omega}{c} \times \text{Re}\left(\sqrt{\frac{\varepsilon_p \cdot \varepsilon_g}{\varepsilon_p + \varepsilon_g}}\right) \quad (2)$$

In the expression (2), m is a positive integer. In addition, Re( ) is a function for extracting a real part of the complex number within the parentheses. For the sake of simplicity, when a case in which the angle of incidence is 0° is considered, the expression (3) is obtained.

$$L = m\lambda \times \text{Re}\left(\sqrt{\frac{\varepsilon_p + \varepsilon_g}{\varepsilon_p \cdot \varepsilon_g}}\right) \quad (3)$$

In order to excite surface plasmon resonance, the material for the structure portion 101 is limited to a material having a negative value in the real part of the dielectric constant. Specifically, such materials include Ag, Au, Cu, Pt, and Al, as described above. Although the lattices 120 of the structure portion 101 may partially contain a material having a positive value in the real part of the complex dielectric constant, the real part of the complex dielectric constant of the structure portion 101 as a whole needs to be negative.

In addition, when the angle of incidence of the excitation light is 0°, the period L of lattices 120 in the structure portion 101 that enables the surface plasmon resonance is determined by the expression (3). In the device 100 in which LT-GaAs is used as a material for the semiconductor layer 110 and Au is used as a material or the structure portion 101, when the wavelength of the excitation light is 0.8 μm, the period of the structure portion 101 at which the surface plasmon resonance is excited is desirably around 200 nm. When the wavelength of the excitation light is 1.55 μm, the period of the structure portion 101 at which the surface plasmon resonance is excited is desirably around 700 nm. When excitation light having a wavelength in a broad band, such as femtosecond pulsed light, is used, it is preferable that the period of the structure portion 101 be set in accordance with the wavelength that achieves the maximum power, but any of the wavelengths of light contained in the excitation light may be used.

When the structure portion 101 is disposed on the semiconductor layer 110, the thickness of the structure portion 101 (the thickness of each lattice 120) may be no greater than at least one-third the wavelength of the excitation light and is more preferably approximately one-tenth the wavelength of the excitation light. When the thickness of the structure portion 101 is no less than one-third the wavelength of the excitation light, reflection of the excitation light by the structure portion 101 increases, and the surface plasmon resonance may not be excited efficiently. When the structure portion 101 includes an anti-reflection film 140, it is desirable that the thickness of the lattices 120 be no greater than at least 1/(3n) the wavelength of the excitation light with the refractive index n of the anti-reflection film 140 at the wavelength of the excitation light taken into consideration.

The following case will be considered. Specifically, the surface of the semiconductor layer 110 is irradiated normally with the excitation light from the side on which the structure portion 101 is disposed, and the surface plasmon resonance is excited at an interface 103 between the structure portion 101 and the semiconductor layer 110. The electric field of a surface plasmon wave excited through the surface plasmon resonance propagates along the interface 103 in the direction parallel to the periodic direction. In addition, of the electric field of the surface plasmon wave, the electric field that propagates through the semiconductor layer 110 is attenuated exponentially in the semiconductor layer 110. Thus, the distance that the electric field of the surface plasmon wave propagates in the semiconductor layer 110 is extremely short. Therefore, the surface plasmon wave is localized at the interface 103, and the electric field intensity of the surface plasmon wave is enhanced by at least ten times or more relative to the electric field intensity of the excitation light. Accordingly, as compared to the photoconductive device in which the surface plasmon resonance is not utilized as described in Japanese Patent Laid-Open No. 2013-80939, for example, the optical absorption of the excitation light at the interface 103 is high.

Hereinafter, a relationship between a propagation distance $t_P$ that the surface plasmon wave excited by the surface plasmon resonance propagates in the semiconductor layer 110 and an electric field intensity $I_p(t_P)$ of the surface plasmon wave will be described. Here, the propagation distance $t_P$ is defined as the distance that the surface plasmon wave propagates through the semiconductor layer (through the semiconductor layer 110) in the direction perpendicular to the interface 103 (the depthwise direction of the semiconductor layer 110). It is to be noted that the propagation distance $t_P$ is positive when the surface plasmon wave travels toward the inside of the semiconductor layer 110 from the interface 103. The relationship between the electric field intensity $I_P(t_P)$ of the surface plasmon wave and the propagation distance $t_P$ in the semiconductor layer 110 is expressed through the expression (4). In the expression (4), $I_P(t_P=0)$ is the electric field intensity of the surface plasmon wave at the interface 103.

$$\frac{I_P(t_P)}{I_P(t_P=0)} = \exp\left(-\frac{t_P}{z}\right) \quad (4)$$

In the expression (4), z represents a mean propagation distance that a surface plasmon wave propagates until the electric field intensity thereof becomes 1/e-fold (e is the Napier's constant) with the electric field intensity being normalized by the electric field intensity $I_P(t_P=0)$ of the surface plasmon wave excited at the interface 103. In other words, the mean propagation distance z is the propagation distance of the surface plasmon wave in the semiconductor layer 110 that is necessary for the electric field intensity of the surface plasmon wave excited at the surface of the structure portion 101 on the side of the semiconductor layer 110 (the interface 103 in the present exemplary embodiment) to become 1/e-fold. The mean propagation distance z is expressed through the expression (5). In the expression (5), Im( ) is a function for extracting an imaginary part of the complex number within the parentheses.

$$z = \frac{\lambda}{4\pi}\left[\text{Im}\left(\sqrt{\frac{\varepsilon_p^2}{\varepsilon_g + \varepsilon_p}}\right)\right]^{-1} \quad (5)$$

As an example, in a case of the device 100 in which LT-GaAs is used as a material for the semiconductor layer 110 and Au is used as a material for the structure portion 101, the mean propagation distance z when the excitation light having a wavelength of 0.8 μm is used is approximately 10 nm to 50 nm. In addition, the mean propagation distance z when the wavelength of the excitation light is 1.55 μm is approximately 100 nm to 250 nm. A reason why the mean propagation distance z varies is that the real part and the imaginary part of the effective complex dielectric constant $\varepsilon_p$ change when the duty cycle of the lattices 120 relative to the period L of the lattices 120 (the proportion of the width of a lattice relative to the period L) changes. In other words, as the duty cycle is higher, the effective complex dielectric constant $\varepsilon_p$ approaches the complex dielectric constant of LT-GaAs, which is the semiconductor layer 110, and the mean propagation distance z thus becomes shorter.

The mean propagation distance z in which the electric field intensity of the surface plasmon wave becomes 1/e the electric field intensity of the surface plasmon wave at the interface 103 is a mean distance that the surface plasmon wave can propagate in the semiconductor layer 110 in the depthwise direction thereof when the surface plasmon wave is regarded as numerous photons. Accordingly, when the propagation distance $t_P$ is no less than the mean propagation distance z, it can be considered that a change in the absorption efficiency of the excitation light by the semiconductor layer 110 is small and sufficient absorption efficiency is obtained. Therefore, it is desirable that the propagation distance $t_P$ of the surface plasmon wave be no less than the mean propagation distance z.

Accordingly, in the present exemplary embodiment, the thickness $t_S$ of the semiconductor layer 110 in a region in which the structure portion 101 is disposed is adjusted to no less than the mean propagation distance z. In other words, the shortest distance from the interface 103 to an interface 104 between the semiconductor layer 110 and the substrate 111 in the direction perpendicular to the surface of the structure portion 101 on the side of the semiconductor layer 110 (the interface 103 in the present exemplary embodiment) is adjusted to no less than the mean propagation distance z. With this configuration, sufficient optical absorption of the surface plasmon wave by the semiconductor layer 110 can be expected. Furthermore, it can be said that this configuration has no influence on an increase in the power of the terahertz wave pulse.

The semiconductor layer 110 may absorb a terahertz wave having a certain frequency (optical phonon absorption frequency, hereinafter, referred to as the "phonon absorption frequency") $f_F$ through the optical phonon absorption (hereinafter, referred to as the "phonon absorption"). Hereinafter, under the assumption that a terahertz wave is radiated from the bias lines 102 toward the semiconductor layer 110, a relationship between a propagation distance $t_F$ of the terahertz wave having a frequency of the phonon absorption frequency $f_F$ and an electric field intensity $I_F(t_F)$ of the terahertz wave having the phonon absorption frequency $f_F$ will be described. Here, the propagation distance $t_F$ is defined as the distance that the terahertz wave having the phonon absorption frequency $f_F$ propagates through the semiconductor layer 110 in the direction perpendicular to the interface 103. It is to be noted that the propagation distance $t_F$ is positive when the terahertz wave travels toward the inside of the semiconductor layer 110 from the interface 103. In this case, the relationship between the electric field intensity $I_F(t_F)$ of the terahertz wave and the propagation distance $t_F$ in the semiconductor layer 110 is expressed through the expression (6). In the expression (6), $I_F(t_F=0)$ represents the electric field intensity of the terahertz wave having the phonon absorption frequency $f_F$ held before propagating in the semiconductor layer 110, $I_F(t_F)$ represents the electric field intensity of the terahertz wave that has propagated the propagation distance $t_F$ in the semiconductor layer 110, and $\alpha$ represents the absorption coefficient of the terahertz wave at the phonon absorption frequency $f_F$.

$$\frac{I_F(t_F)}{I_F(t_F=0)} = \exp(-\alpha t_F) \quad (6)$$

When a crystal has many defects and has an irregular periodical structure, as in LT-GaAs or LT-InGaAs, the phonon absorption spectrum becomes broad around the phonon absorption frequency $f_F$ at the center, as compared to a high crystalline material. Thus, the terahertz wave is attenuated by the phonon absorption over a broad band. Therefore, in order to output or detect a terahertz wave over a broad band, it is necessary to reduce absorption of a terahertz wave having the phonon absorption frequency $f_F$ or a frequency around the phonon absorption frequency $f_F$.

It is desirable that the phonon absorption of the terahertz wave by the semiconductor layer 110 be no greater than twice the mean distance that the terahertz wave having the phonon absorption frequency $f_F$ can propagate through the semiconductor layer 110. To achieve the above, it is desirable that the propagation distance $t_F$ be no greater than the distance in which the electric field intensity of the terahertz wave becomes $1/e^2$ times the electric field intensity of the terahertz wave at the surface of the structure portion 101 on the side of the semiconductor layer 110 (the interface 103 in the present exemplary embodiment). When the propagation distance $t_F$ exceeds twice the mean distance that the terahertz wave having the phonon absorption frequency $f_F$ can propagate, a signal of the terahertz wave having the phonon absorption frequency $f_F$ may not be acquired, and the phonon absorption of the terahertz wave by the semiconductor layer 110 ceases to be negligible.

Accordingly, in the present exemplary embodiment, the thickness $t_S$ of the semiconductor layer 110 in a region in which the structure portion 101 is disposed on the semiconductor layer 110 is adjusted to no greater than a distance in which the electric field intensity $I_F(t_F)$ of the terahertz wave becomes $1/e^2$ times the electric field intensity of the terahertz wave at the interface 103.

In one example, when LT-GaAs is selected as a material for the semiconductor layer 110, the phonon absorption frequency $f_F$ thereof is around 8.1 THz, and the propagation distance in which the electric field intensity is attenuated to $1/e^2$ is approximately 500 nm. Therefore, the electric field intensity of a terahertz wave that has propagated the distance of 500 nm is $e^2$ times greater than the electric field intensity of a terahertz wave that has propagated the distance of 1 µm, and the phonon absorption by the semiconductor layer 110 can be reduced to $1/e^2$. As a result, a terahertz wave over a broad band can be generated or detected.

When the semiconductor layer 110 is disposed on the substrate 111, it is desirable that the substrate 111 contain a material having phonon absorption at a frequency higher than the phonon absorption frequency $f_F$ of the semiconductor layer or a material having no phonon absorption. Furthermore, it is desirable that a material that is not absorptive of a terahertz wave in a broad frequency band and that is transparent be used. Specific examples of a material for the substrate 111 include silicon (Si). Si is preferable because Si has no phonon absorption up to 15 THz and is transparent to a terahertz wave in a terahertz frequency equal to or less than 15 THz.

Summarizing the above, in the present exemplary embodiment, the thickness $t_S$ of the semiconductor layer 110 is set to no less than the propagation distance (no less than the mean propagation distance z) in which the electric field intensity of the surface plasmon wave becomes $1/e$ times the electric field intensity of the surface plasmon wave at the interface 103. In addition, the thickness $t_S$ of the semiconductor layer 110 is set to no greater than the propagation distance in which the electric field intensity of the terahertz wave having the phonon absorption frequency $f_F$ becomes $1/e^2$ times the electric field intensity of the terahertz wave at the interface 103. It is desirable that the thickness $t_S$ of the semiconductor layer 110 satisfy the expression (1). With this configuration, the excited surface plasmon wave can be absorbed sufficiently in the semiconductor layer 110, and the absorption of the terahertz wave having the phonon absorption frequency $f_F$ can be reduced to fall within a permissible range.

$$\frac{\lambda}{4\pi}\left[\mathrm{Im}\left(\sqrt{\frac{\varepsilon_p^2}{\varepsilon_g + \varepsilon_p}}\right)\right]^{-1} \leq t_S \leq \frac{2}{\alpha} \quad (1)$$

Figure 2:
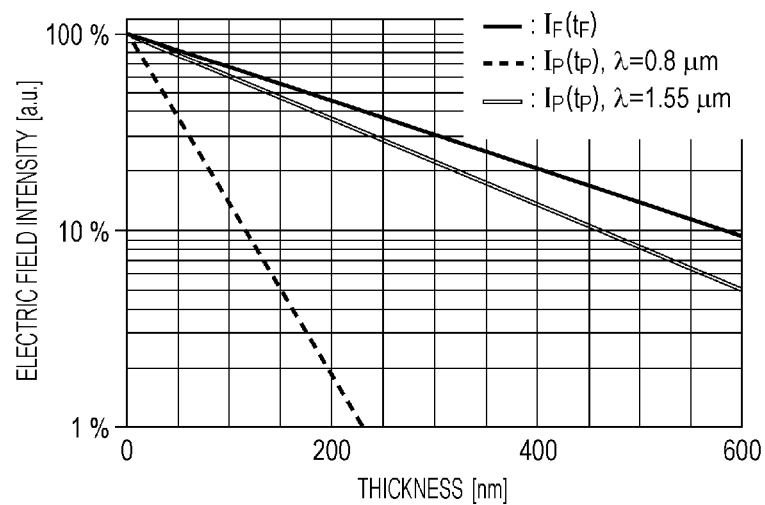
FIG. 2 is a semi-log plot for describing a relationship between a propagation distance within a semiconductor layer and electric field intensities of a surface plasmon wave and of a terahertz wave having an optical phonon absorption frequency.

FIG. 2 illustrates a relationship between the electric field intensities of the surface plasmon wave and of the terahertz wave having the phonon absorption frequency $f_F$ and the thickness of the semiconductor layer 110 in the device 100. Here, the device 100 in which the semiconductor layer 110 is formed of LT-GaAs, the structure portion 101 is formed of Au and has a duty cycle of 0.5, and $SiO_2$ serving as an anti-reflection film 140 is provided is illustrated as an example. The electric field intensity of the surface plasmon wave when the wavelength of the excitation light is 0.8 µm is indicated by a dashed line, and the electric field intensity of the surface plasmon wave when the wavelength of the excitation light is 1.55 μm is indicated by a double line. In addition, the electric field intensity of the terahertz wave having the phonon absorption frequency $f_F$ is indicated by a solid line.

When the wavelength of the excitation light is 0.8 μm, the mean propagation distance z is approximately 50 nm. When the wavelength of the excitation light is 1.55 μm, the mean propagation distance z is approximately 200 nm. In addition, the absorption coefficient a of LT-GaAs at 8.1 THz is approximately 40000 cm$^{-1}$. Accordingly, the thickness of the LT-GaAs layer is set to at least no less than 50 nm and no greater than 500 nm when the wavelength of the excitation light is 0.8 μm, and the thickness of the LT-GaAs layer is set to at least no less than 200 nm and no greater than 500 nm when the wavelength of the excitation light is 1.55 μm. With this configuration, a terahertz wave over a broad band can be generated or detected while a decrease in the generation efficiency or the detection efficiency is suppressed. As a result, a photoconductive device that achieves both an increase in the power and an increase in the bandwidth of a terahertz wave pulse can be obtained.

With the use of the expression (5), the mean propagation distance z can be obtained on the basis of the wavelength of the excitation light, the complex dielectric constant of the lattices 120 at the wavelength of the excitation light, the complex dielectric constant of the semiconductor layer 110, the complex dielectric constant of a material around the lattices 120, and the duty cycle. In addition, the propagation distance in which the electric field intensity of the terahertz wave having the phonon absorption frequency becomes 1/e$^2$ is uniquely determined when the absorption coefficient of the material for the semiconductor layer 110 at the phonon absorption frequency is known.

The effective complex dielectric constant $\epsilon_p$ determined by the distribution of the complex dielectric constant of one or a plurality of substances in contact with the lattices 120 can be obtained through the expression (7). In the expression (7), ϵ(ω,x,y,z) represents the distribution of the complex dielectric constant with the interface 103 between the semiconductor layer 110 and the structure portion 101 serving as a reference, j represents the imaginary unit, $k_z$ represents the component of the wave number of the surface plasmon wave in the depthwise direction of the semiconductor layer 110, and $t_S$ represents the thickness of the semiconductor layer 110. The integration range D in the expression (7) covers a region in which the semiconductor layer 110 and the structure portion 101 are in contact with each other in terms of the XY-direction and a range that contains the semiconductor layer 110 and an anti-reflection film 140 in terms of the Z-direction, with the interface 103 between the semiconductor layer 110 and the structure portion 101 serving as a reference.

$$\varepsilon_p = \frac{\int\int\int_D \text{Re}\left[\sqrt{\varepsilon(w, x, y, z)}\right]\exp(2 jk_z t_s)}{\int\int\int_D \exp(2 jk_z t_s)} \quad (7)$$

Figure 8:
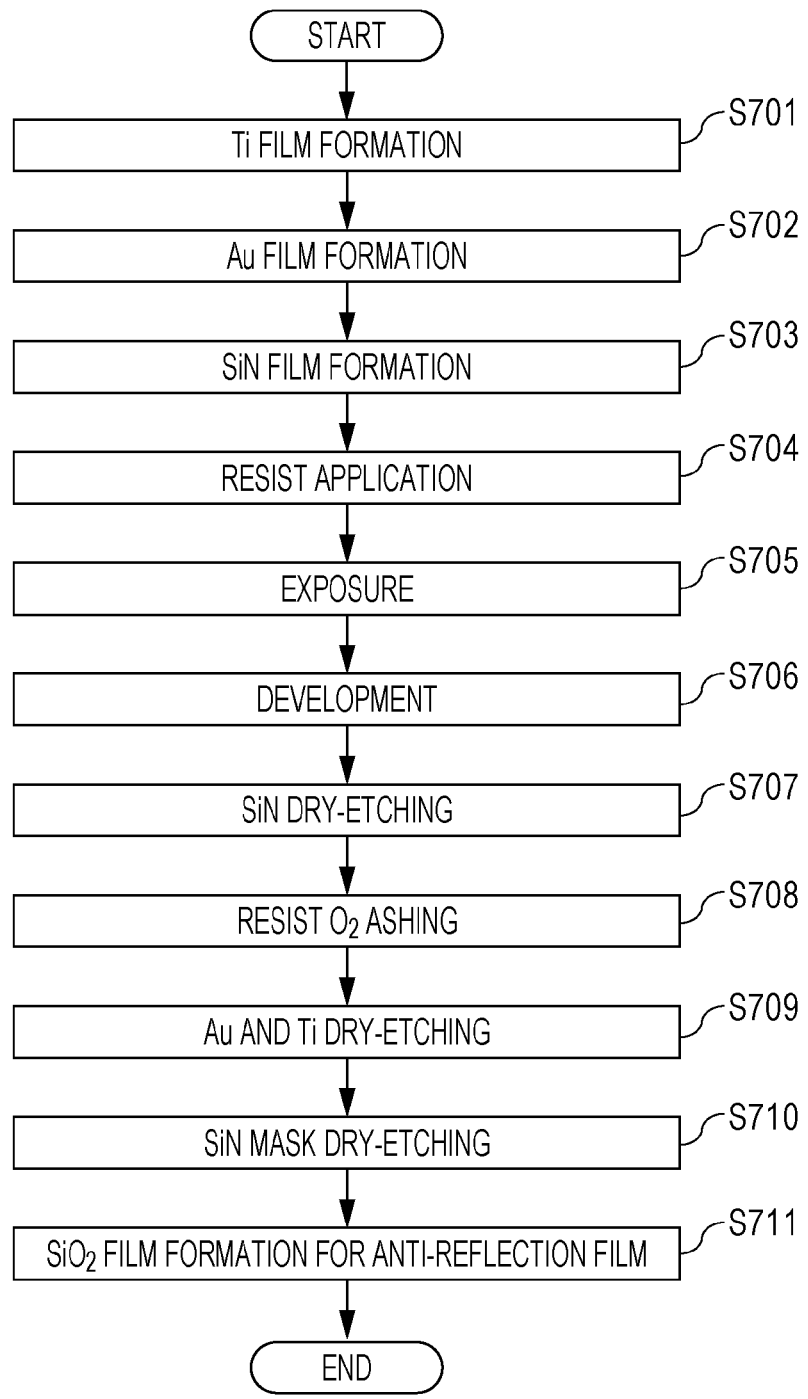
FIG. 8 is a flowchart illustrating a method of manufacturing the photoconductive device according to the first exemplary embodiment.

A method of manufacturing the device 100 will now be described with reference to FIG. 8. FIG. 8 is a flowchart illustrating a method of manufacturing the device 100. In the present exemplary embodiment, a method in which the structure portion 101 and the bias lines 102 are fabricated in block will be described.

Lt-GaAs is used as a material for the semiconductor layer 110, and Au is used as a material for the structure portion 101 and the bias lines 102. In addition, SiO$_2$ is used for an anti-reflection film 140. The wavelength of the excitation light is in a 1.55 μm band, and the carrier excitation method in LT-GaAs is multiphoton absorption. The carrier generation efficiency by multiphoton absorption, which is one of the nonlinear optical effects, is proportional to the square of the electric field generated in the semiconductor layer 110. Therefore, the effect of increasing the carrier generation efficiency by an electric field enhancement effect through the surface plasmon resonance or a field localization effect is greater in the case of multiphoton absorption than in the case of one-photon absorption.

The dielectric constant of Au for the excitation light having a wavelength of 1.55 μm is −135 from the Drude model, and the dielectric constant of LT-GaAs is 11.4. The duty cycle is 0.5. In this case, the period L of the lattices 120 is approximately 700 nm when m is 1 through the expression (3). In addition, the thickness of the structure portion 101 is set to approximately 100 nm with the refractive index of the SiO$_2$ anti-reflection film 140 taken into consideration.

In manufacturing the device 100, first, a 10 nm thick Ti film is formed on LT-GaAs in order to increase the adhesiveness between LT-GaAs serving as the semiconductor layer 110 and Au serving as the structure portion 101 and the bias lines 102 (S701). After the Ti film is formed, a 100 nm thick Au layer containing Au is formed on the Ti film (S702). Furthermore, A SiN layer to be used as a mask material when the Au layer is etched is formed on the Au layer with the use of a plasma chemical vapor deposition (CVD) technique (S703). Aside from the SiN layer, SiO$_2$ or a metal mask, such as Ni or Cr, may also be used.

Thereafter, a resist is applied (S704), and exposure is carried out (S705). The exposure may be carried out by an electron beam exposure apparatus or by any exposure apparatus capable of exposing a fine linewidth of several hundred nanometers, such as an i-line stepper or a KrF stepper. After the exposure, a resist pattern is formed through development (S706), and the SiN layer is dry-etched (S707). When the etching of the SiN layer is finished, the resist is removed through asking (S708). Subsequently, the Au layer and the Ti film are dry-etched with the SiN layer serving as a mask (S709). Thereafter, the SiN layer serving as the mask for the Ti film and the Au layer, which are to form the structure portion 101, is dry-etched (S710). Lastly, a film of SiO$_2$ is formed to form an anti-reflection film 140 (S711).

With such a manufacturing method, the device 100 can be manufactured. According to the manufacturing method described above, the structure portion 101 and the bias lines 102 can be fabricated in block through a photolithography process or the like. Thus, a reduction in the number of processes during manufacturing or in the material cost can be expected.

The manufacturing method is not limited to the one described above, and the device 100 can also be fabricated through another manufacturing method. For example, after two structure portions 101 are fabricated on the semiconductor layer 110 first, two bias lines 102 are fabricated so as to be electrically connected to the respective structure portions 101. In this case, the structure portions 101 are fabricated through the method described in the flowchart illustrated in FIG. 8, and the bias lines 102 are fabricated with the use of photolithography and lift-off.

Figure 10A:
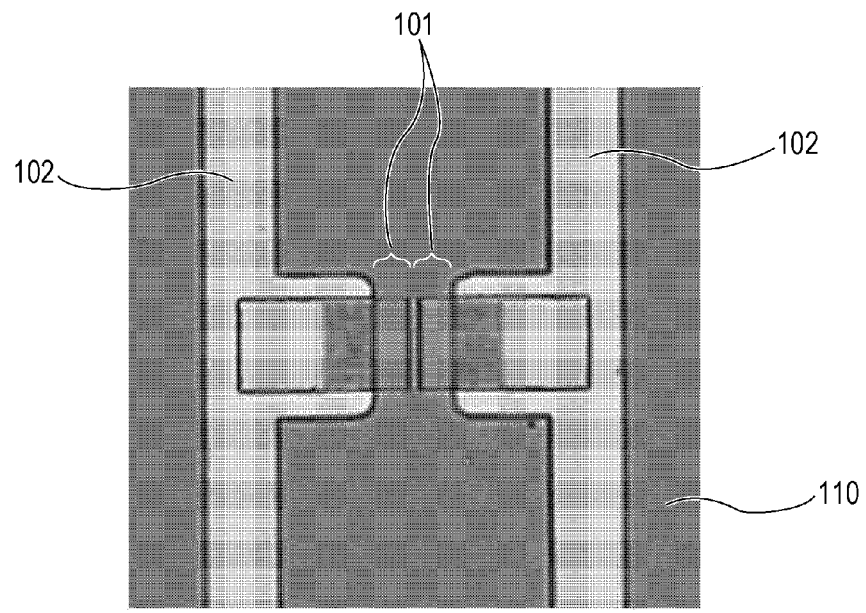
FIG. 10A is an optical microscope image of the photoconductive device according to the first exemplary embodiment.
Figure 10B:
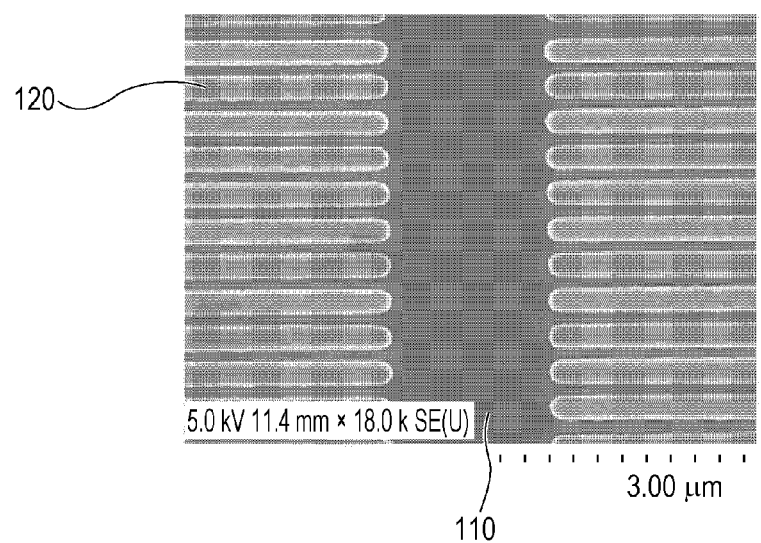
FIG. 10B is a scanning electron microscope (SEM) image of structure portions of the photoconductive device according to the first exemplary embodiment.

FIG. 10A illustrates an optical microscope image of an actually fabricated device 100 capable of surface plasmon resonance. In addition, FIG. 10B illustrates an SEM image of the structure portions 101. As illustrated in FIGS. 10A and 10B, the device 100 includes the bias lines 102 and the structure portions 101 disposed on the semiconductor layer 110, and the bias lines 102 and the structure portions 101 are connected to each other.

As described thus far, with the device 100 according to the present exemplary embodiment, a terahertz wave over a broad band can be generated or detected while a decrease in the generation efficiency or the detection efficiency is suppressed. The device 100 can generate or detect a terahertz wave with the use of surface plasmon resonance and can achieve both an increase in the power and an increase in the bandwidth of a terahertz wave pulse.

Second Exemplary Embodiment

Figure 3A:
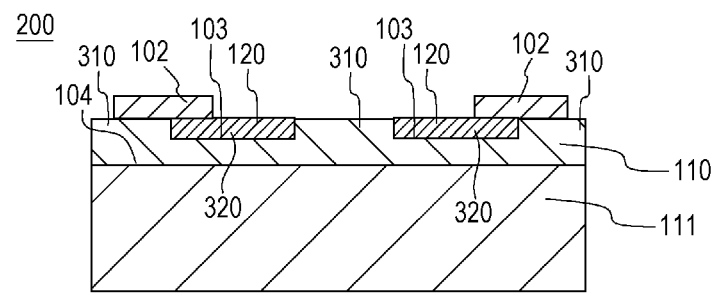
FIG. 3A is a sectional view of a photoconductive device, taken along a direction orthogonal to a periodic direction, according to a second exemplary embodiment.
Figure 3B:
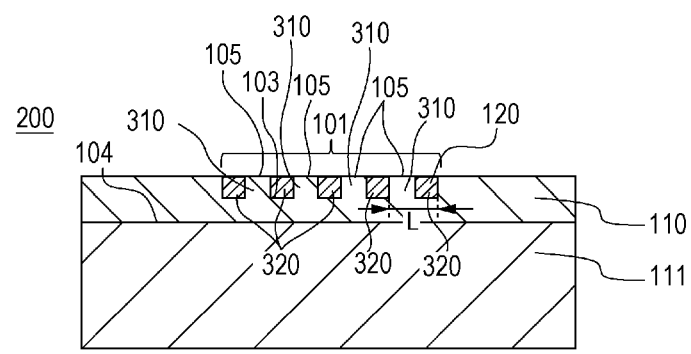
FIG. 3B is another sectional view of the photoconductive device, taken along the periodic direction, according to the second exemplary embodiment.

A photoconductive device 200 (hereinafter, referred to as the device 200) according to a second exemplary embodiment will be described. Descriptions of portions that are common to those of the first exemplary embodiment will be omitted. FIG. 3A is a sectional view of the device 200 taken along the direction orthogonal to the periodic direction on a surface of a semiconductor layer 110, and FIG. 3B is a sectional view of the device 200 taken along the periodic direction. In the device 100 according to the first exemplary embodiment, the semiconductor layer 110 has a flat surface, and the structure portion 101 is disposed on the flat surface. In contrast, in the device 200, the semiconductor layer 110 has an uneven surface, and lattices 120 of a structure portion 101 are disposed in concave portions 320.

When a terahertz wave is to be generated, a voltage is applied across the structure portions 101, and carriers excited as a surface plasmon wave is absorbed in the semiconductor layer 110 flow toward the structure portions 101. Furthermore, the power of the terahertz wave is dependent on a change over time in the current density caused by the optically excited carriers.

At this point, the electric field generated by the applied voltage is weaker at a position far away from the structure portions 101 than at a position near the structure portions 101. Thus, carriers generated at a position away from the structure portions 101 are less likely to flow toward the structure portions 101, and the carriers are highly likely to recouple with the semiconductor layer 110 before reaching the structure portions 101. Therefore, in order to increase the power of the terahertz wave, it is desirable that a structure that facilitates the flow of the carriers excited by the absorption of the surface plasmon wave toward the structure portions 101 before the carriers recouple with the semiconductor layer 110 be employed so as to increase the number of carriers that reach the structure portions 101.

Accordingly, in the present exemplary embodiment, as illustrated in FIGS. 3A and 3B, the semiconductor layer 110 includes convex portions 310 and the concave portions 320 formed in its surface, and the lattices 120 of the structure portions 101 are disposed in the concave portions 320. The surface plasmon wave is primarily excited at surfaces 105 of the convex portions 310 of the semiconductor layer 110 and at surfaces of the lattices 120 that are not in contact with the semiconductor layer 110.

As described in the first exemplary embodiment, the surface plasmon wave propagates through the semiconductor layer 110 while being attenuated exponentially with the surfaces 105 of the convex portions 310 of the semiconductor layer 110 serving as a reference. Therefore, the thickness $t_S$ of the semiconductor layer 110 is adjusted to no less than the mean propagation distance z in which the electric field intensity of the surface plasmon wave at the surfaces 105 of the convex portions 310 of the semiconductor layer 110 becomes 1/e-fold. More desirably, the thickness $t_S$ of the semiconductor layer 110 is set to a thickness that satisfies the expression (1). As a result, sufficient optical absorption of the surface plasmon wave by the semiconductor layer 110 can be expected.

In the present exemplary embodiment, as compared to the first exemplary embodiment, the electric field generated by an applied voltage is stronger, and the carriers excited in the semiconductor layer 110 and the structure portions 101 are closer to each other. Therefore, the change over time in the current density can be increased. Accordingly, as compared to the first exemplary embodiment, the power of a terahertz wave pulse can be increased by several-fold at a maximum in the electric field intensity.

It is to be noted that the present exemplary embodiment is not limited to the structure in which the lattices 120 are disposed in the concave portions when the semiconductor layer 110 has an uneven structure. For example, the lattices 120 may be disposed on the convex portions 310, metal films capable of surface plasmon resonance may be disposed on the surfaces of the concave portions 320 and the convex portions 310, or a metal film having an uneven shape reflecting the shapes of the concave portions 320 and the convex portions 310 may be disposed.

Bias lines 102 may be disposed on the semiconductor layer 110 as illustrated in FIG. 3A, or may be disposed in the concave portions 320 of the semiconductor layer 110 similarly to the structure portions 101.

Figure 9:
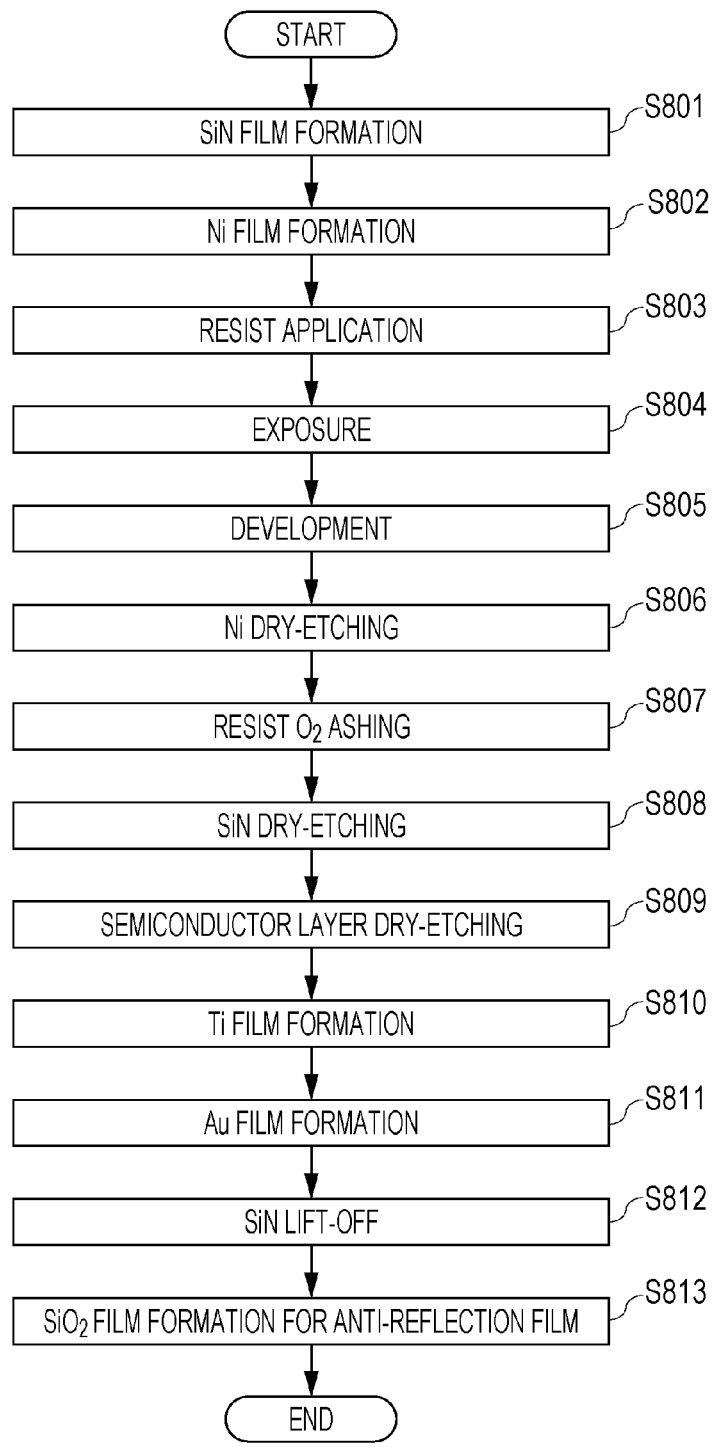
FIG. 9 is a flowchart illustrating a method of manufacturing the photoconductive device according to the second exemplary embodiment.

A method of manufacturing the device 200 will be described with reference to FIG. 9. FIG. 9 is a flowchart illustrating a method of manufacturing the device 200. Descriptions of portions that are common to those described thus far will be omitted. In the present exemplary embodiment, as in the first exemplary embodiment, LT-GaAs is selected as a material for the semiconductor layer 110, and Au is selected as a material for the structure portions 101 and the bias lines 102. In addition, $SiO_2$ is selected for an anti-reflection film (not illustrated). The wavelength of the excitation light is in a 1.55 μm band, and the carrier excitation method in LT-GaAs is multiphoton absorption.

The dielectric constant of Au for the excitation light having a wavelength of 1.55 μm is −135 from the Drude model, and the dielectric constant of LT-GaAs is 11.4. The duty cycle is 0.5. The period L of the lattices 120 is approximately 600 nm when m is 1 through the expression (3). A reason why the period L is shorter than that of the first exemplary embodiment is that the proportion of the LT-GaAs layer around the lattices 120 in the structure portions 101 is higher and the real part of the effective complex dielectric constant is thus greater. A structure in which the structure portions 101 are embedded in the concave portions of the semiconductor layer 110 is employed, and the depth of the concave portions 320 of the semiconductor layer 110 is 400 nm. This is twice the propagation distance z of the surface plasmon wave in the semiconductor layer 110 described in the first exemplary embodiment. In addition, the thickness of the semiconductor layer 110 is 500 nm, which is greater than the depth of the concave portions 320 of the semiconductor layer 110.

In the present exemplary embodiment, a method in which the structure portions 101 and the bias lines 102 are fabricated in block will be described. First, a SiN layer that is to serve as a mask during etching of LT-GaAs serving as the semiconductor layer 110 is formed (S801), and a Ni layer is formed (S802). Thereafter, a resist is applied (S803), and exposure is carried out (S804). After the exposure, a resist pattern is formed through development (S805), and the Ni layer is dry-etched (S806). Then, the resist is removed through asking (S807), and the SiN layer is dry-etched thereafter (S808).

Next, LT-GaAs that is to serve as the semiconductor layer 110 is etched with the Ni layer and the SiN layer serving as a mask (S809). Subsequently, a Ti film is formed in order to increase the adhesiveness between Au serving as a material for the structure portions 101 and LT-GaAs (S810). Then, a film of Au serving as the material for the structure portions 101 is formed (S811). At this point, films of Ti and Au are formed on side walls of the Ni layer and the SiN layer, but by removing the SiN film through wet-etching, the Ni film, the Ti film, the Au film adhering to the SiN film are lift off as a whole (S812). Lastly, a film of $SiO_2$ is formed through sputtering or plasma CVD on a gap portion between the antennas to form an anti-reflection film (S813).

With such a manufacturing method, the device 200 can be manufactured. According to the manufacturing method described above, the structure portions 101 and the bias lines 102 can be fabricated in block through a photolithography process or the like. Thus, a reduction in the number of processes or in the material cost can be expected.

As described thus far, with the device 200 according to the present exemplary embodiment, a terahertz wave over a broad band can be generated or detected while a decrease in the generation efficiency or the detection efficiency is suppressed. The device 200 can generate or detect a terahertz wave with the use of surface plasmon resonance. Furthermore, in the case of the structure in which the semiconductor layer 110 has an uneven shape, the electric field generated by an applied voltage can be enhanced, and thus the power of a terahertz wave to be generated or detected can be made higher than that of the first exemplary embodiment.

Third Exemplary Embodiment

Figure 4:
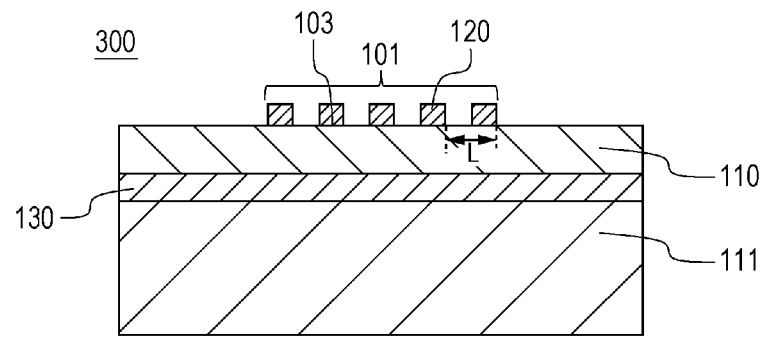
FIG. 4 is a schematic diagram for describing a configuration of a photoconductive device according to a third exemplary embodiment.

A photoconductive device 300 (hereinafter, referred to as the device 300) according to a third exemplary embodiment will be described with reference to FIG. 4. Descriptions of portions that are common to those described above will be omitted. As described in the first exemplary embodiment, when the semiconductor layer 110 is disposed on the substrate 111, it is desirable that the substrate 111 be formed of a material having phonon absorption at a frequency higher than the phonon absorption frequency $f_F$ of the semiconductor layer 110 or a material having no phonon absorption. Furthermore, it is desirable that Si, which is not absorptive to a terahertz wave in a broad frequency band and is transparent to a terahertz wave in a band as broad as possible, be used.

However, when Si is used for the substrate 111 and the semiconductor layer 110 having a thickness of no greater than approximately 1 μm is disposed directly on the substrate 111, the resistance between the bias lines 102 may decrease due to a current path through the substrate 111 because Si has low electrical resistivity. When the resistance between the bias lines 102 is low, the voltage across the bias lines 102 may decrease or noise may increase while the photoconductive device is in operation, and this is not preferable in terms of increasing the power or the bandwidth of a terahertz wave pulse.

Therefore, the device 300 includes a semiconductor layer 110 and a buffer layer 130 disposed between the semiconductor layer 110 and a substrate 111. Bias lines 102 and a structure portion 101 are disposed on the semiconductor layer 110. The buffer layer 130 is disposed on a surface of the semiconductor layer 110 that is opposite to another surface of the semiconductor layer 110 on which the bias lines 102 and the structure portion 101 are disposed. In other words, the buffer layer 130 is disposed on the surface of the semiconductor layer 110 that is opposite to the surface on which the bias lines 102 and the structure portion 101 are disposed with the semiconductor layer 110 interposed therebetween.

The semiconductor layer 110 has a similar configuration to the semiconductor layer 110 according to the first exemplary embodiment. The electrical resistivity of the buffer layer 130 is higher than the electrical resistivity of the semiconductor layer 110. Similarly to the substrate 111, it is desirable that the buffer layer 130 be formed of a material that has phonon absorption at a frequency equal to or greater than the phonon absorption frequency $f_F$ of the semiconductor layer 110. If the electrical resistivity of the buffer layer 130 is extremely higher than the electrical resistivity of the semiconductor layer 110, the buffer layer 130 may be thinner than the semiconductor layer 110 and may be constituted by a plurality of layers.

The buffer layer 130 may also function to reduce the difference between the lattice constant of the substrate 111 and the lattice constant of the semiconductor layer 110. A case in which LT-GaAs is used for the semiconductor layer 110 and Si is used for the substrate 111 will be considered as an example. The lattice constant of Si and the lattice constant of LT-GaAs differ by approximately 4%. Therefore, a monolayer or a multilayer containing, for example, a Ge layer, a GaAs layer, an AlAs layer, or an AlGaAs layer can be provided as the buffer layer 130.

When a material that is phonon absorptive at 8.1 THz, which is the phonon absorption frequency $f_F$ of the semiconductor layer 110, is contained in the buffer layer 130, it is desirable that the thickness of the semiconductor layer 110 be determined with the absorption coefficient of the buffer layer 130 at 8.1 THz taken into consideration. Examples of materials that are phonon absorptive at a frequency of 8.1 THz include a GaAs layer or an AlGaAs layer. Accordingly, when the buffer layer 130 contains a material that is phonon absorptive at the phonon absorption frequency $f_F$ of the semiconductor layer 110, the thickness of the semiconductor layer 110 and the buffer layer 130 is set to a thickness that satisfies the expression (1).

It is to be noted that a layer (not illustrated) that does not contain a material that is phonon absorptive at the phonon absorption frequency $f_F$ of the semiconductor layer 110 may be disposed as a buffer layer between the semiconductor layer 110 and the substrate 111 of the first exemplary embodiment. In this case, the thickness of the semiconductor layer 110 is set to a thickness that satisfies the expression (1) without the thickness of the buffer layer taken into consideration. In addition, a functional layer, such as another buffer layer, may further be provided between the semiconductor layer including the buffer layer 130 and the substrate 111 of the present exemplary embodiment.

For example, when the buffer layer 130 partially contains a GaAs layer, a configuration in which the sum of the thickness of the buffer layer 130 and the thickness of the semiconductor layer 110 is no greater than 500 nm is employed. When the device 300 is used only to generate or to detect a terahertz wave, the electric field intensity of the terahertz wave at 8.1 THz, which is the phonon absorption frequency $f_F$, is retained to an electric field intensity that is no less than $1/e^2$ times the electric field intensity held before the phonon absorption. When the device 300 is used both to generate and to detect a terahertz wave, an electric field intensity that is no less than $1/e^4$-fold is retained in the end.

As described thus far, with the device 300, a terahertz wave over a broad band can be generated or detected while a decrease in the generation efficiency or the detection efficiency is suppressed. In addition, by providing the buffer layer 130, a decrease in the resistance between the bias lines 102 can be suppressed, which can contribute to an increase in the power and an increase in the bandwidth of a terahertz wave pulse.

Fourth Exemplary Embodiment

Figure 5A:
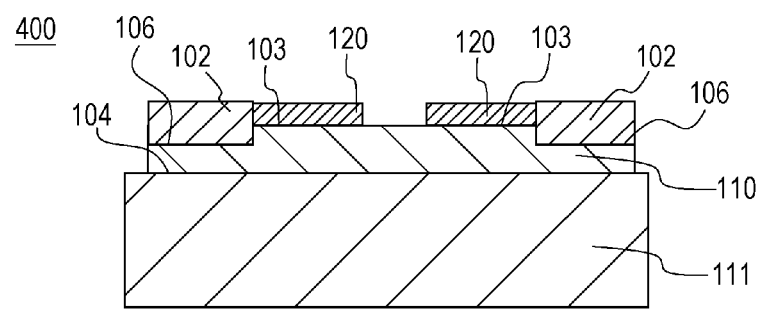
FIG. 5A is a sectional view of a photoconductive device, taken along a direction orthogonal to a periodic direction, according to a fourth exemplary embodiment.
Figure 5B:
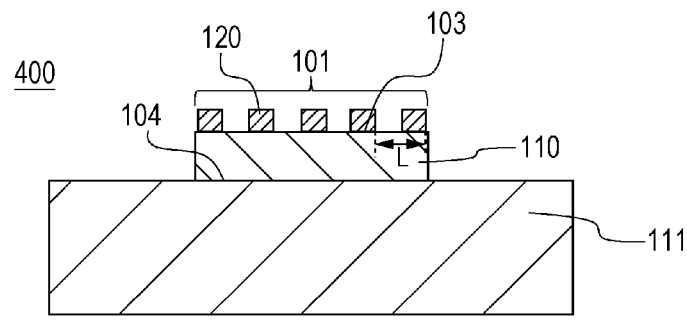
FIG. 5B is another sectional view of the photoconductive device, taken along the periodic direction, according to the fourth exemplary embodiment.

A photoconductive device 400 (hereinafter, referred to as the device 400) according to a fourth exemplary embodiment will be described. Descriptions of portions that are common to those described above will be omitted. FIG. 5A is a sectional view of the device 400 taken along the direction orthogonal to the periodic direction on a surface of a semiconductor layer 110, and FIG. 5B is a sectional view of the device 400 taken along the periodic direction.

As illustrated in FIG. 5A, the semiconductor layer 110 of the device 400 is disposed on a substrate 111, and a structure portion 101 and two bias lines 102 are disposed on the semiconductor layer 110. The semiconductor layer 110 and the substrate 111 form an interface 104, the semiconductor layer 110 and lattices 120 of the structure portion 101 form interfaces 103, and the semiconductor layer 110 and the bias lines 102 form interfaces 106. The thickness of the semiconductor layer 110 at a portion in which the structure portion 101 is disposed on the semiconductor layer 110 (the distance between the interface 103 and the interface 104) is greater than the thickness of the semiconductor layer 110 at a portion in which the bias lines 102 are disposed on the semiconductor layer 110 (the distance between the interface 106 and the interface 104). The interface 104 is an interface between the substrate 111 and the semiconductor layer 110. In addition, as illustrated in FIG. 5B, the semiconductor layer 110 is not present at a portion in which the structure portion 101 and the bias lines 102 are not disposed.

Hereinafter, a case in which LT-GaAs is used for the semiconductor layer 110 will be described as an example. The phonon absorption frequency $f_F$ of LT-GaAs is 8.1 THz. Thus, the wavelength in a free space is approximately 37 µm, and the wavelength in LT-GaAs is approximately 10 µm from the refractive index. The optical absorption of a surface plasmon wave occurs primarily in the vicinity of the interface 103 on the semiconductor layer 110 that is in contact with the structure portion 101. In the meantime, a terahertz wave at the phonon absorption frequency $f_F$ of the semiconductor layer 110 resonates in the bias lines 102 that also serve as antennas and is radiated from a portion between the projection portions of the bias lines 102.

When the distance between the bias lines 102 is short as compared to the wavelength corresponding to 8.1 THz in the semiconductor layer 110, the thickness of a portion of the semiconductor layer 110 in which the structure portion 101 is not disposed is made less than the thickness of a portion of the semiconductor layer 110 in which the structure portion 101 is disposed. In other words, the thickness of a portion of the semiconductor layer 110 that is not in contact with the structure portion 101 is made less than the thickness of a portion of the semiconductor layer 110 that is in contact with the structure portion 101. Alternatively, it is desirable that a structure in which the semiconductor layer 110 is not present be employed. With this configuration, the propagation distance $t_F$ of a terahertz wave at 8.1 THz in the semiconductor layer 100 can be reduced, and the absorption of a terahertz wave at the phonon absorption frequency $f_F$ or a frequency in the vicinity of the phonon absorption frequency $f_F$ can be reduced as compared to that of the first exemplary embodiment as a result. For example, when the area of a region between the projection portions of the bias lines 102 is no greater than 10 µm² and the semiconductor layer 110 is disposed only in that region, the amount of phonon absorption in the semiconductor layer 110 can be reduced as compared to that in the case of a configuration such as the device 100.

As described thus far, with the device 400, a terahertz wave over a broad band can be generated or detected while a decrease in the generation efficiency or the detection efficiency is suppressed. In addition, absorption of a terahertz wave at the phonon absorption frequency $f_F$ or a frequency in the vicinity of the phonon absorption frequency $f_F$ in the semiconductor layer 110 can be further reduced, and a terahertz wave pulse over a broader band can be generated or detected.

Fifth Exemplary Embodiment

Figure 6:
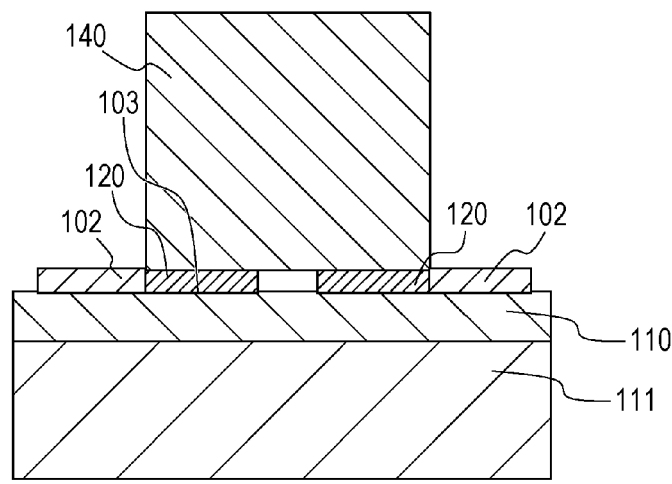
FIG. 6 is a schematic diagram for describing a configuration of a photoconductive device according to a fifth exemplary embodiment.

A photoconductive device 500 (hereinafter, referred to as the device 500) according to a fifth exemplary embodiment will be described with reference to FIG. 6. FIG. 6 is an illustration for describing a configuration of the device 500. The device 500 according to the present exemplary embodiment has an optical fiber 140 connected thereto. Other configurations of the device 500 are similar to those of the first exemplary embodiment, and thus descriptions thereof will be omitted.

The optical fiber 140 is an optical waveguide member that guides the excitation light to a structure portion 101 and a semiconductor layer 110. In order to efficiently excite surface plasmon resonance, it is desirable that the optical fiber 140 be a polarization maintaining fiber that maintains the polarization direction of the excitation light. The structure portion 101 may be in direct contact with the optical fiber 140. Alternatively, an anti-reflection film that suppresses Fresnel reflection may be disposed between an end portion of the optical fiber 140 and the semiconductor layer 110, and the structure portion 101 may be in contact with the optical fiber 140 with the anti-reflection film interposed therebetween. In addition, the optical fiber 140 may be compensated for dispersion so that the pulse duration of the excitation light does not increase, or the optical fiber 140 may be formed of a material with which the pulse duration of the excitation light is most compressed at the exit end of the optical fiber 140.

According to the present exemplary embodiment, a terahertz wave over a broad band can be generated or detected while a decrease in the generation efficiency or the detection efficiency is suppressed. In addition, by guiding the excitation light with the use of the optical fiber 140, an increase in the power and an increase in the bandwidth of a terahertz wave pulse can both be achieved. In addition, a measurement apparatus that includes the device 500 serving as a generation unit or a detection unit of a terahertz wave pulse can simplify the optical system and increase the flexibility in measurement.

Sixth Exemplary Embodiment

Figure 7:
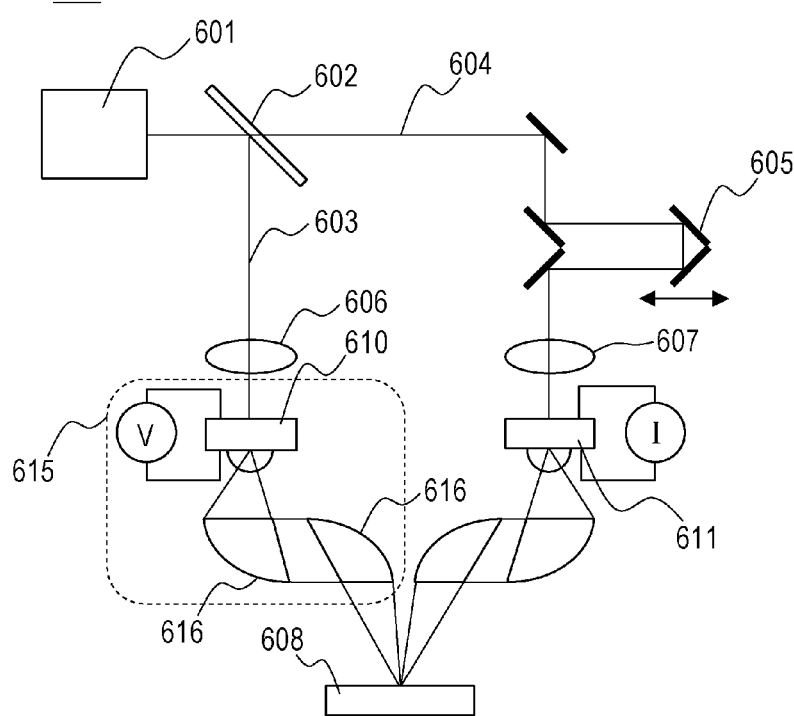
FIG. 7 is a schematic diagram for describing a configuration of a measurement apparatus according to a sixth exemplary embodiment.

In a sixth exemplary embodiment, a measurement apparatus 600 (hereinafter, referred to as the apparatus 600) that includes any one of the photoconductive devices described in the foregoing exemplary embodiments will be described with reference to FIG. 7. Descriptions of portions that are common to those described above will be omitted. FIG. 7 is an illustration for describing a configuration of the apparatus 600. The apparatus 600 is a terahertz time-domain spectroscopy (THz-TDS) apparatus that acquires a time-domain waveform of a terahertz wave pulse with the use of a THz-TDS technique. The basic configuration of the THz-TDS apparatus is basically the same as the configuration of conventionally known THz-TDS apparatuses, and thus only the overview will be described.

The apparatus 600 includes a light source 601 that outputs ultrashort pulsed light serving as excitation light, a beam splitter 602, a delay unit 605, lenses 606 and 607, an irradiation unit 615, and a detection unit 611. The irradiation unit 615 includes a generation unit 610 and an optical unit 616.

The excitation light from the light source 601 is split into pumping light 603 and probe light 604 by the beam splitter 602. The pumping light 603 is incident on the generation unit 610 via the lens 606. The probe light 604 is incident on the detection unit 611 via the delay unit 605 and the lens 607. In the present exemplary embodiment, a fiber laser that outputs femtosecond pulsed light in a 1.55 band is used as the light source 601.

The generation unit 610 generates a terahertz wave upon the pumping light being incident thereon. The detection unit 611 detects a terahertz wave upon the terahertz wave and the probe light being incident thereon. In the present exemplary embodiment, any one of the photoconductive devices according to the first through fifth exemplary embodiments is used in at least one of the generation unit 610 and the detection unit 611. Herein, a case in which the device 100 is used in each of the generation unit 610 and the detection unit 611 will be described. LT-GaAs can be used for the semiconductor layer 110 in each of the devices 100, and carriers can be generated through a multiphoton absorption effect.

A terahertz wave generated by the generation unit 610 is guided to a measurement object 608 and is reflected by the measurement object 608. The reflected terahertz wave is detected by the detection unit 611. The terahertz wave pulse reflected by the measurement object 608 contains information including an absorption spectrum of the measurement object 608. The delay unit 605 is an optical delay system that changes the optical path length of the probe light 604, and the difference between the optical path length of the pumping light and the optical path length of the probe light is adjusted by moving the delay unit 605. Thus, a timing at which a terahertz wave is detected by the detection unit 611 can be controlled. The time-domain waveform of the terahertz wave can be acquired on the basis of the detection result of the detection unit 611.

Although the terahertz wave reflected by the measurement object 608 is detected in the present exemplary embodiment, a configuration may be such that a terahertz wave transmitted through the measurement object 608 is detected by the detection unit 611.

Hereinafter, a measurement example in which the apparatus 600 according to the sixth exemplary embodiment is used will be described. Measurement is carried out by using the device 100 for each of the generation unit 610 and the detection unit 611. A biological tissue section serving as the measurement object 608 is placed in tight contact with a quartz plate (not illustrated), whose complex refractive index is known, and the measurement is carried out. The quartz plate (not illustrated) is a z-cut quartz plate that measures 1 mm in thickness, 25 mm on a longitudinal side, and 70 mm on a lateral side. The biological tissue section is a sectioned brain tissue of a rat brain in which a tumor has been artificially cultured (hereinafter, referred to as a brain section). The brain section is placed in tight contact with the quartz plate, and the measurement is carried out by irradiating, with a terahertz wave, the surface of the quartz plate that is opposite to the surface that is in tight contact with the brain section. In the measurement, a time-domain waveform that includes at least a terahertz wave reflected by the interface between the air and the quartz plate and a terahertz wave pulse reflected by the interface between the quartz plate and the brain section is acquired. A refractive index spectrum of the brain section can be acquired from the acquired time-domain waveform. In the measurement, the area of the brain section that is in tight contact with the quartz plate is approximately 1.0 cm$^2$.

The brain section is measured at 20 by 20 points at the interval of 500 mm, and the refractive index spectrum of the biological tissue section is measured at each measurement point. The time it takes to carry out the measurement at the total of 400 points is 10 minutes or less, and the refractive index difference discrimination performance of the apparatus 600 has been confirmed to be no greater than 0.01 in a frequency range from 0.1 THz to 3 THz. A refractive index difference ($\Delta n$=0.02 to 0.04 at 0.8 THz to 1.5 THz) that is significant to the refractive index spectrum has been observed between a tumor portion and a normal portion of the brain section. The refractive index of the tumor portion is higher than the refractive index of the normal portion. Factors for the refractive index difference can be that the amount of moisture in the tumor portion is larger than the amount of moisture in the normal portion or that the density of the cell nucleus is higher in the tumor portion than in the normal portion.

As described above, the apparatus 600 includes any one of the photoconductive devices according to the first through fifth exemplary embodiments used in at least one of the generation unit 610 and the detection unit 611. The photoconductive device according to each of the exemplary embodiments can generate or detect a terahertz wave over a broad band while a decrease in the generation efficiency or the detection efficiency is suppressed. Therefore, with the apparatus 600 according to the present exemplary embodiment, the measurement accuracy can be improved, the measurement time can be reduced, and the band of the measured spectral information can be broadened.

Thus far, exemplary embodiments of the present invention have been described, but the present invention is not limited to these exemplary embodiments, and various modifications and changes can be made within the spirit of the present invention.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2015-166053 filed Aug. 25, 2015, which is hereby incorporated by reference herein in its entirety.

What is claimed is:
1. A photoconductive device that generates or detects terahertz radiation, comprising:
  a semiconductor layer;
  a structure portion in contact with the semiconductor layer, the structure portion being configured to receive light input from a light source and to excite a surface plasmon wave with the light; and an electrode electrically connected to the structure portion, wherein the semiconductor layer has a thickness that is no less than a first propagation distance and no greater than a second propagation distance, the first propagation distance being a distance that the surface plasmon wave propagates through the semiconductor layer in a perpendicular direction of an interface between the semiconductor layer and the structure portion until an electric field intensity of the surface plasmon wave becomes 1/e times the electric field intensity of the surface plasmon wave at the interface, the second propagation distance being a distance that a terahertz wave having an optical phonon absorption frequency of the semiconductor layer propagates through the semiconductor layer in the perpendicular direction until an electric field intensity of the terahertz wave becomes $1/e^2$ times the electric field intensity of the terahertz wave at the interface.

2. The photoconductive device according to claim 1, wherein the thickness of the semiconductor layer satisfies Expression (1), $$\frac{\lambda}{4\pi}\left[\mathrm{Im}\left(\sqrt{\frac{\varepsilon_p^2}{\varepsilon_g + \varepsilon_p}}\right)\right]^{-1} \leq t_S \leq \frac{2}{\alpha} \quad (1)$$

wherein $t_S$ represents the thickness of the semiconductor layer, $\lambda$ represents a wavelength of the light, $\epsilon_g$ represents a complex dielectric constant of a material for the structure portion at the wavelength $\lambda$ of the light, $\epsilon_p$ represents an effective complex dielectric constant determined by a distribution of a complex dielectric constant of a substance in contact with the structure portion, and $\alpha$ represents an absorption coefficient of the terahertz wave.

3. The photoconductive device according to claim 1, wherein the semiconductor layer includes a surface having a convex portion and a plurality of concave portions that are disposed periodically, and wherein the structure portion includes lattices disposed in the concave portions.

4. The photoconductive device according to claim 1, wherein a region of the semiconductor layer in which the structure portion is disposed has a thickness greater than a thickness of at least a portion of a region of the semiconductor layer in which the structure portion is not disposed.

5. The photoconductive device according to claim 1, wherein the semiconductor layer is disposed in a region in which the structure portion can excite the surface plasmon wave.

6. The photoconductive device according to claim 1, further comprising:

a buffer layer disposed on a surface of the semiconductor layer that is opposite to a surface on which the structure portion is disposed with the semiconductor layer interposed therebetween.

7. The photoconductive device according to claim 6, wherein a sum of the thickness of the semiconductor layer and a thickness of the buffer layer is no less than the first propagation distance and no greater than the second propagation distance.

8. The photoconductive device according to claim 1, wherein the structure portion includes a plurality of lattices that are disposed periodically.

9. The photoconductive device according to claim 1, wherein the semiconductor layer includes at least any one of GaAs, InGaAs, InAs, InSb, InAsSb, InGaSb, InP, Ge, and GaN.

10. The photoconductive device according to claim 1, further comprising:

a substrate disposed on a surface of the semiconductor layer that is opposite to a surface on which the structure portion is disposed with the semiconductor layer interposed therebetween.

11. The photoconductive device according to claim 10, wherein the substrate does not undergo optical phonon absorption or has an optical phonon absorption frequency higher than an optical phonon absorption frequency of the semiconductor layer.

12. The photoconductive device according to claim 1, wherein the structure portion includes an anti-reflection film disposed on a surface on which the light is incident.

13. The photoconductive device according to claim 1, wherein the electrode is disposed so as to be in contact with the semiconductor layer.

14. The photoconductive device according to claim 1, wherein the electrode is a first electrode, and the photoconductive device further includes a second electrode disposed so as to be spaced apart from the first electrode.

15. The photoconductive device according to claim 1, wherein Expression (2) is satisfied, $$\frac{\omega}{c}\sin\theta + \frac{2\pi m}{L} = \frac{\omega}{c} \times \mathrm{Re}\left(\sqrt{\frac{\varepsilon_p \cdot \varepsilon_g}{\varepsilon_p + \varepsilon_g}}\right) \quad (2)$$

wherein c represents the speed of the light, $\lambda$ represents a wavelength of the light, $\omega$ represents an angular frequency of the light, $\theta$ represents an angle of incidence of the light, $\epsilon_g$ represents a complex dielectric constant of the structure portion at the wavelength $\lambda$ of the light, $\epsilon_p$ represents an effective complex dielectric constant determined by a distribution of a complex dielectric constant of a substance in contact with the structure portion, m is any positive integer, and Re( ) is a function for extracting a real part of a complex number in the parentheses.

16. The photoconductive device according to claim 1, further comprising:

an optical fiber configured to guide the light to the structure portion.

17. The photoconductive device according to claim 1, wherein a wavelength of light corresponding to a band gap energy of the semiconductor layer is shorter than a wavelength of the light.

18. A measurement apparatus, comprising:

a generation unit configured to generate a terahertz wave upon light being incident on the generation unit; and a detection unit configured to detect a terahertz wave transmitted through a measurement object or reflected by the measurement object, wherein at least one of the generation unit and the detection unit includes the photoconductive device according to claim 1.

* * * * *